(12) United States Patent
Godil et al.

(10) Patent No.: US 6,501,600 B1
(45) Date of Patent: Dec. 31, 2002

(54) POLARIZATION INDEPENDENT GRATING MODULATOR

(75) Inventors: Asif A. Godil, Mountain View; Benjamin Wai-ho Chui, Sunnyvale; David M. Bloom, Palo Alto; Kenneth A. Honer, Santa Clara, all of CA (US)

(73) Assignee: LightConnect, Inc., Newark, CA (US)

( * ) Notice: Subject to any disclaimer, the term of this patent is extended or adjusted under 35 U.S.C. 154(b) by 0 days.

(21) Appl. No.: 09/548,788

(22) Filed: Apr. 13, 2000

Related U.S. Application Data

(63) Continuation-in-part of application No. 09/372,649, filed on Aug. 11, 1999, now Pat. No. 6,169,624.
(60) Provisional application No. 60/171,685, filed on Dec. 21, 1999.

(51) Int. Cl.[7] .................................................. G02B 5/18
(52) U.S. Cl. ........................ 359/569; 359/558; 359/566; 359/572
(58) Field of Search .......................... 385/140; 359/558, 359/569, 566, 573, 572, 290, 291

(56) References Cited

U.S. PATENT DOCUMENTS

| | | | |
|---|---|---|---|
| 4,441,791 A | 4/1984 | Hornbeck | 350/360 |
| 4,571,024 A | 2/1986 | Husbands | 350/96.19 |
| 5,255,332 A | 10/1993 | Welch et al. | 385/17 |
| 5,311,360 A | 5/1994 | Bloom et al. | 359/572 |
| 5,420,416 A | 5/1995 | Iida et al. | 250/201.1 |
| 5,629,801 A | 5/1997 | Staker et al. | 359/572 |
| 5,661,592 A | 8/1997 | Bornstein et al. | 359/291 |
| 5,731,802 A | 3/1998 | Worley, III | 345/691 |
| 5,745,271 A | 4/1998 | Ford et al. | 359/130 |
| 5,764,280 A | 6/1998 | Bloom et al. | 348/53 |
| 5,793,912 A | 8/1998 | Boord et al. | 385/37 |
| 5,798,743 A | 8/1998 | Bloom | 345/90 |
| 5,805,759 A | 9/1998 | Fukushima | 385/140 |
| 5,808,797 A | 9/1998 | Kowarz et al. | 359/573 |
| 5,841,579 A | 11/1998 | Bloom et al. | 359/572 |
| 5,943,158 A | 8/1999 | Ford et al. | 359/295 |
| 5,982,553 A | 11/1999 | Bloom et al. | 359/627 |
| 5,986,634 A | 11/1999 | Alloshin et al. | 345/126 |
| 6,004,912 A | 12/1999 | Gudeman | 508/577 |
| 6,064,404 A | 5/2000 | Aras et al. | 345/507 |
| 6,069,576 A | 5/2000 | Gwin | 341/112 |
| 6,088,102 A | 7/2000 | Manhart | 356/354 |
| 6,101,036 A | 8/2000 | Bloom | 359/567 |
| 6,130,770 A | 10/2000 | Johnson | 355/67 |
| 6,169,624 B1 * | 1/2001 | Godil et al. | 359/237 |
| 6,178,284 B1 | 1/2001 | Bergmann et al. | 385/140 |
| 6,215,579 B1 | 4/2001 | Goossen | 359/124 |
| 6,251,842 B1 | 6/2001 | Gudeman | 508/577 |
| 6,271,808 B1 | 8/2001 | Corbin | 345/7 |

FOREIGN PATENT DOCUMENTS

| | | | |
|---|---|---|---|
| EP | 0 555 778 A2 | 8/1993 | H01S/3/25 |
| EP | 0654917 A2 | 5/1995 | H04J/14/02 |
| JP | 1-142505 | 6/1989 | G02B/6/28 |
| WO | WO 91/13377 | 5/1991 | G02B/6/28 |
| WO | WO 93/02375 | 4/1993 | G02B/26/00 |
| WO | WO 96/27810 | 12/1996 | G02B/5/18 |
| WO | WO 99/38348 | 7/1999 | H04Q/11/00 |

OTHER PUBLICATIONS

Parker, Michael C. "Dynamic Digital Holographic Wavelength Filtering", Journal of Lightwave Technology, vol. 16, No. 7, Jul. 1998.

(List continued on next page.)

*Primary Examiner*—Georgia Epps
*Assistant Examiner*—John J. Magee
(74) *Attorney, Agent, or Firm*—James E. Eakin

(57) ABSTRACT

A fiber-optic modulator based on a micromachined grating device which is both polarization independent and achromatic in behavior is described. The device is a two dimensional grating or periodic structure which is symmetric in the X and Y axes. It is comprised of a membrane with holes cut in it that moves downward with the application of a voltage which starts diffracting light. The hole region may have a raised island to provide achromatic behavior.

38 Claims, 6 Drawing Sheets

OTHER PUBLICATIONS

Wang, Lei and Weiner, A.M. "Programmable Spectral Phase Coding of an Amplified Spontaneous Emission Light Source", Optics Communications, 167 (1999) 211–224, Aug. 15, 1999.

Ford, Joseph E. and Walker, James A. "Dynamic Spectral Equalization Using Micro–Opto–Mechanics", IEEE Photonics Technology Letters, vol. 10, No. 10, Oct. 1998.

Minoru, N., "Bidirectional Optical Tuner", Patent Abstracts of Japan, vol. 013, No. 395, Sep. 4, 1989, (JP 01142505).

Hornbeck, L., "Deformable–Mirror Spatial Light Modulators", Spatial Light Modulators and Applications III, Aug. 7–8, 1989, San Diego, CA, SPIE Critical Reviews Series, vol. 1150, pp. 86–102.

Mali, R. et al., "Development of microelectromechanical deformable mirrors for phase modulation of light", Opt. Eng., vol. 36, No. 2, Feb. 1997, pp. 542–548.

Warde, C. et al., "Charge–transfer–plate spatial light modulators", Applied Optics, vol. 31, No. 20, pp. 3971–3979.

Bifano, T. et al. "Continuous–membrane surface–micromachined silicon deformable mirror", Opt. Eng., vol. 36, No. 5, May 1997, pp. 1354–1360.

* cited by examiner

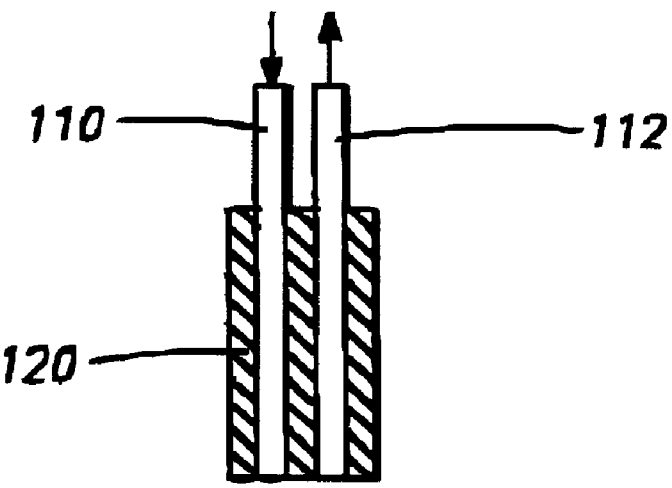
FIG. −1

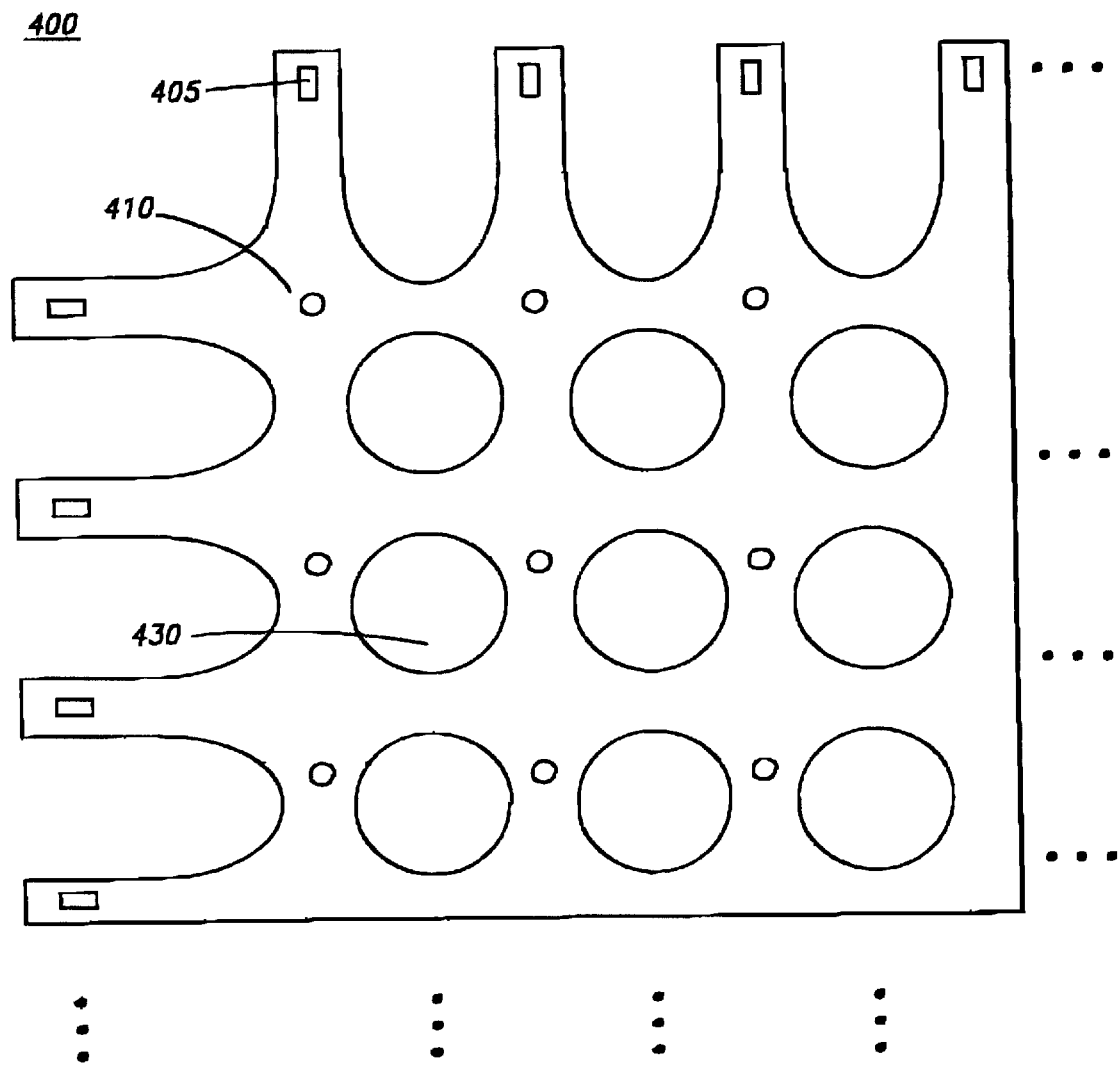
FIG.—4A

FIG.−5A
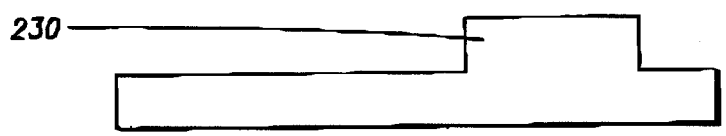
FIG.−5B
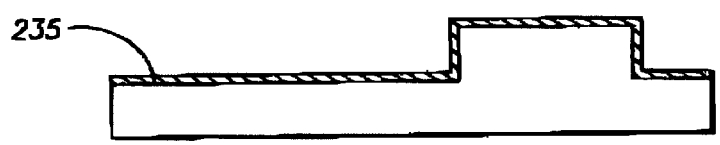
FIG.−5C
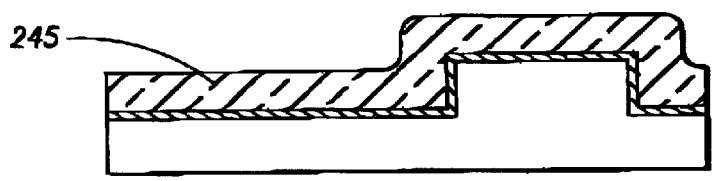
FIG.−5D
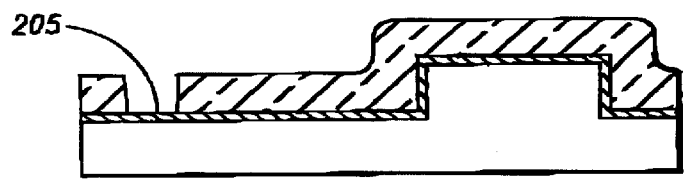
FIG.−5E
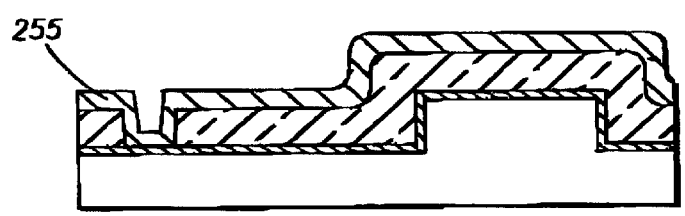
FIG.−5F
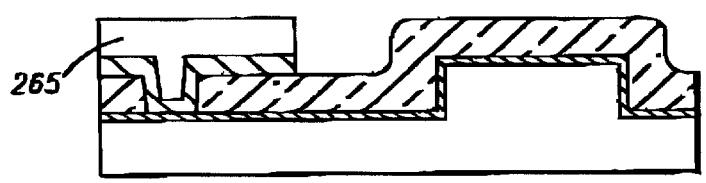
FIG.−5G
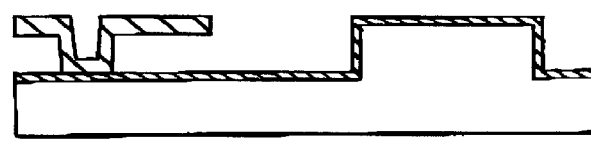
FIG.−5H

POLARIZATION INDEPENDENT GRATING MODULATOR

RELATED APPLICATIONS

This application is a continuation in part of U.S. patent application Ser. No. 09/372,649, filed Aug. 11, 1999, now U.S. Pat. No. 6,169,624, and also claims the benefit of priority to U.S. Provisional Application Ser. No. 60/171,685, filed Dec. 21, 1999, each of which is fully incorporated hereby by reference.

BACKGROUND OF THE INVENTION

1. Field of the Invention

The present invention relates to polarization independent grating modulator. More particularly, the present invention relates to micromachined grating modulators which exhibit polarization independent behavior.

2. Description of Related Art

Optical modulators are an important component in optical systems for controlling and modulating light. In particular, for fiber-optic networks, modulators are used for imparting data modulation on the transmitting laser beam and as an electronically controlled variable optical attenuator (VOA) for channel equalization and power control. In fiber-optic networks the state of polarization is unknown and therefore little or no polarization dependence is tolerated from components.

Bloom et al. (U.S. Pat. No. 5,311,360) demonstrated a micromachined grating modulator comprised of narrow ribbons anchored at the two ends but suspended in the center $\lambda/2$ (half wavelength) above the substrate. The ribbons are separated by gaps of the same width. Both ribbon and gap have a reflective coating from which light is reflected in phase and therefore it emulates a mirror. By applying a voltage to the ribbons, the electrostatic force moves the ribbon down by $\lambda/4$. Now the ribbon and gap are out of phase and all the light is diffracted out in multiple orders. Thus modulation is achieved.

One limitation of the previous invention is that the height difference between the ribbon and gap leads to poor spectral performance. Bloom et al. (U.S. Pat. No. 5,841,579) improved on this by inventing a flat grating light valve comprised of ribbons of equal width with very little gap between them. In the nominal position, all ribbons are at the same height. By applying a voltage and pulling every other ribbon down, the grating is turned on.

For fiber-optic applications operating over the bandwidth of erbium doped fiber amplifier (EDFA), the spectral performance of the previous invention is not acceptable especially at high attenuation. Godil et al. (Achromatic optical modulator, U.S. patent application Ser. No. 09/372,649, filed Aug. 11, 1999, now U.S. Pat. No. 6,169,624) demonstrated a device with alternate narrow and wide ribbon. By proper choice of the ribbon widths and gap width, spectrally flat attenuation over the EDFA band over a large dynamic range is obtained.

A limitation of the previous inventions, because of lack of symmetry, is that they are not completely polarization independent. In particular, at high attenuation the polarization dependence is unacceptably high for fiber-optic networks.

What is needed is a micromachined modulator which exhibits achromatic and polarization independent behavior.

SUMMARY OF THE INVENTION

The present invention is directed towards a fiber-optic modulator comprising of an input optical fiber carrying a light beam through a lens onto a micromachined reflective modulator, back through the lens into an output optical fiber. The micromachined modulator is a two dimensional grating or periodic structure which is modulated by the application of a voltage. The two dimensional grating is symmetric in the X and Y axes, and therefore leads to polarization independent behavior. The achromatic modulator invention of Godil (patent application filed August 1999) is also incorporated to give achromatic behavior.

BRIEF DESCRIPTION OF THE DRAWINGS

FIG. 1 shows a fiber-optic modulator comprised of a micromachined grating device of the present invention

FIGS. 4A–4B show the plan view of the micromachined grating device in the alternate embodiment without achromatic compensation.

FIGS. 5A–5H show a process for fabricating the micromachined grating device.

DETAILED DESCRIPTION OF THE INVENTION

Figure 2A:
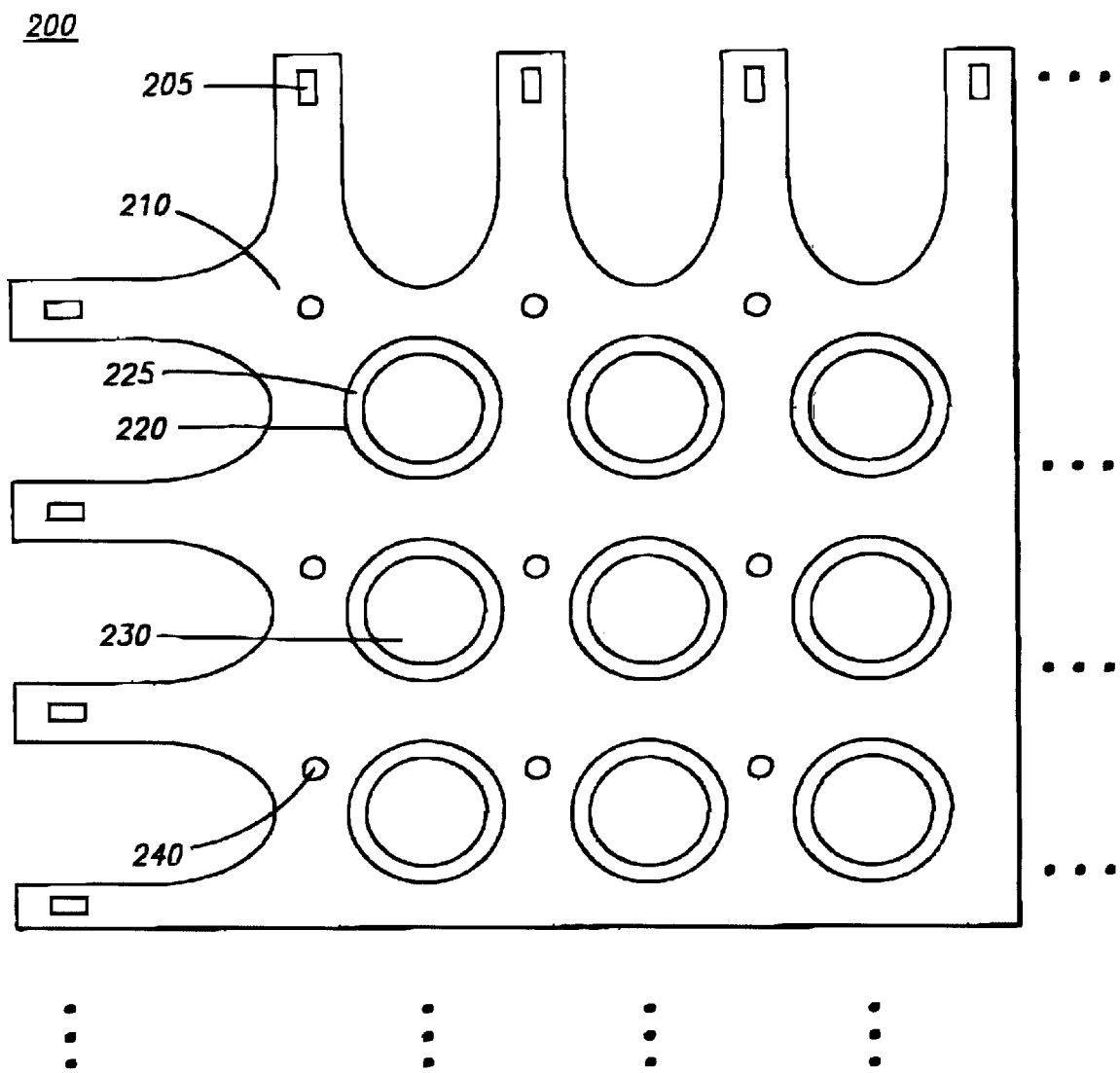
FIGS. 2A–2B show the plan view and cross-sectional view of the micromachined grating device in the preferred embodiment

FIG. 1 shows the fiber-optic micromachined modulator 100 comprised of input fiber 110 and output fiber 112 held in a double bored ferrule 120. Light from the input fiber 110 is collimated by lens 130, impinges on the micromachined device 200, reflects and is focused into the output fiber 112. By applying a voltage to the device 200, light is diffracted in a two-dimensional pattern and the through light in the output fiber is reduced. Thus modulation and attenuation function is achieved.

Figure 2B:
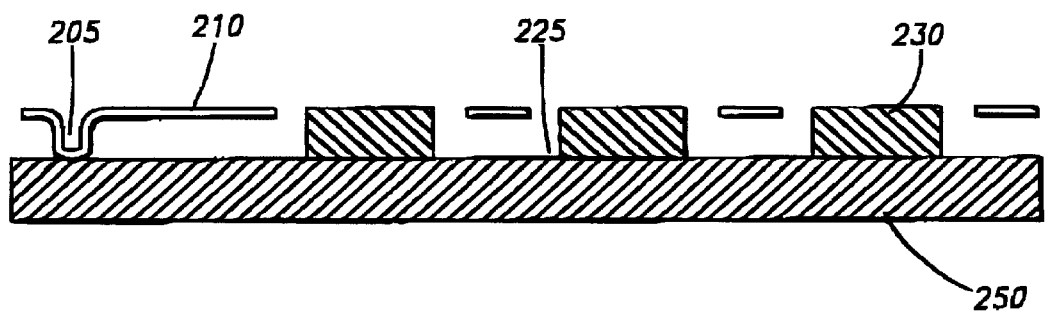

It is desirable to achieve the modulation function in an achromatic and polarization independent way. The device 200 which accomplishes this is shown in FIGS. 2A, 2B with a plan view and cross-sectional view respectively. The device is comprised of a plurality of round islands 230 of height h and a membrane 210 which is anchored 205 all around with a plurality of round holes, or first apertures, 220 cut in membrane 210. Ring regiongs 225 are formed between islands 230 and membrane 210. A pluratlity of release holes, or second apertures, 240 in membrane 210 facilitate the release or etch of the sacrificial layer under the membrane. Plurality of islands 230 are coupled to a substrate 250. Plurality of islands 230 have a total illuminated surface area of $A_i$. Pluarlity of first apertures 220 have a total illuminated surface area of $A_a$. Membrane 210 has a total illuminated surface area $A_m$, where $A_m$ does not include $A_a$. Ring regions 225 have an illuminated surface area $A_d$ that is defined as $A_a$ minus $A_i$. In addition, the magnitudes of the illuminated surface areas $A_m$, $A_i$, and $A_d$ and the ratios of the areas $A_m$, $A_i$, and $A_d$ are selected to provide a substantially achromatic diffraction of the diffractive element over a wavelength range of light that illuminates the diffractive element. A plurality of second aperatures 240 have an illuminated surface are of $A2_a$. In a particular embodiment, $A_d$ is defined as $A2_a$ plus $A_a$ minus $A_i$.

Device 200 is periodic in X and Y with a period $\Lambda$ which is typically in the 20 to 200 micron range. The device is symmetrical in X and Y, and therefore leads to polarization independent behavior. The island 230 has a height h which is mλ/2, where m is an integer and λ is the wavelength of light. Typically m is 3 and for λ=1.55 μm, h is 2.32 μm. The island may be made of silicon, poly silicon, oxide, silicon nitride or it may be silicon covered with oxide or nitride. The top surface of the membrane 210 is nominally coplanar with the islands. The membrane is anchored down to the substrate 250 at discrete anchor points 205. The design of the anchor may be more elaborate for a more rigid anchoring. The substrate 250 may be a silicon wafer, quartz wafer, glass plate, or any other suitable material. The membrane film is tensile which keeps it suspended. The membrane may be silicon nitride, poly silicon, oxide, aluminum, or some other suitable material. The holes 220 in the membrane are larger than the islands. The whole device is covered with a blanket evaporation of aluminum or gold. For h=2.32 μm, light reflected from the ring region 225 between the island and the membrane is 6 π out of phase with respect to the island and the membrane. Therefore the device looks like a mirror in this state which is the on state for the modulator. When a voltage is applied to the membrane, electrostatic force moves the membrane downwards and the device starts diffracting light in a two-dimensional pattern. To achieve full extinction, when the membrane is moved λ/4, it is necessary that the membrane area $A_m$ be equal to the sum of the area $A_i$ of the plurality of islands 230 and the area $A_d$ of ring regions 225. In addition, the invention of Godil (Achromatic optical modulator, U.S. patent application Ser. No. 09/372,649, filed Aug. 11, 1999, now U.S. Pat. No. 6,169,624,) teaches that to obtain achromatic behavior the area $A_d$ of ring regions 225 should be 1/(2 N) of the membrane area $A_m$, where N is an integer. For this particular case, it is ⅙.

Figure 3A:
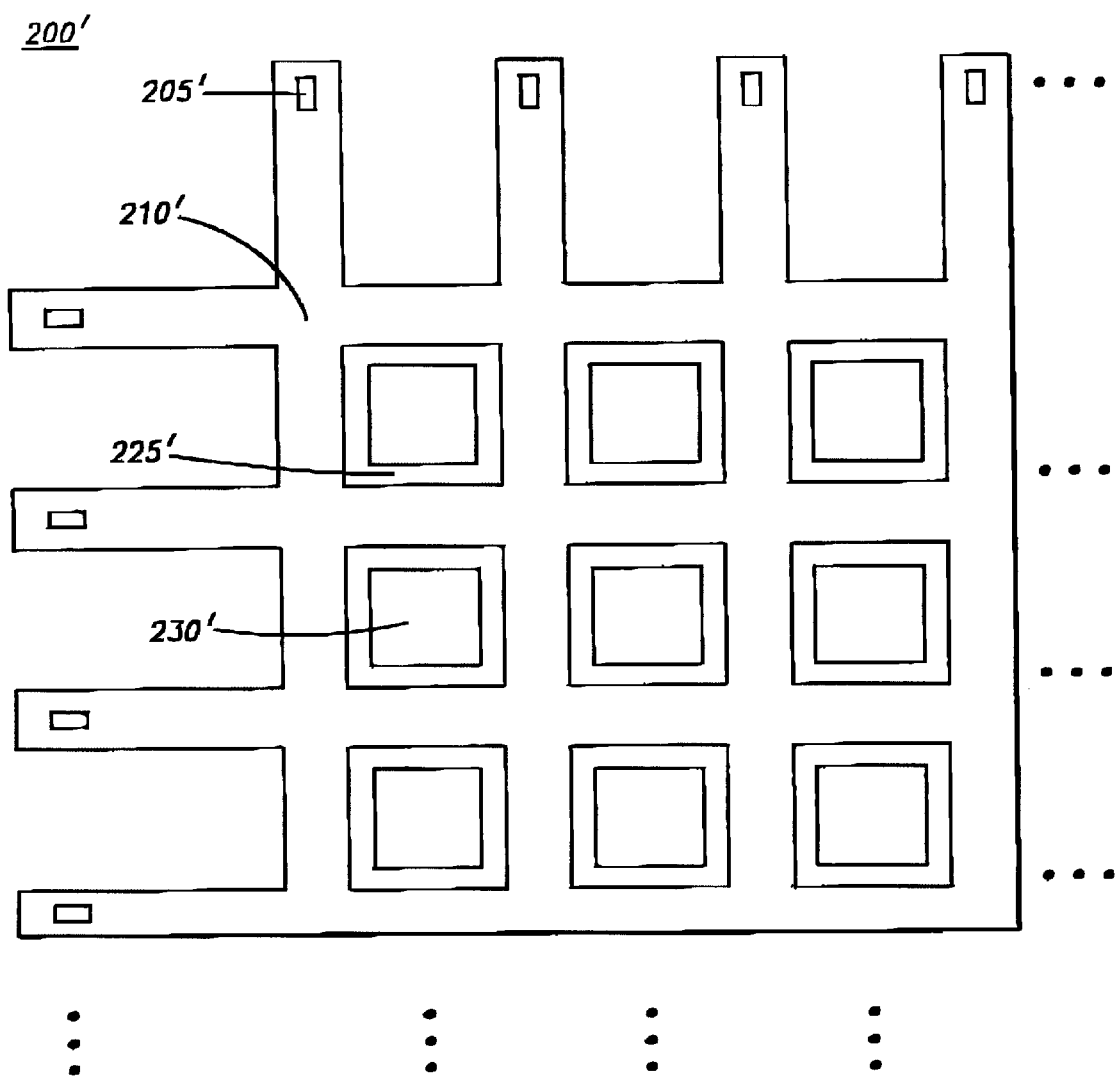
FIGS. 3A–3B show the plan view and cross-sectional view of the micromachined grating device in the alternate embodiment with square holes and islands.
Figure 3B:
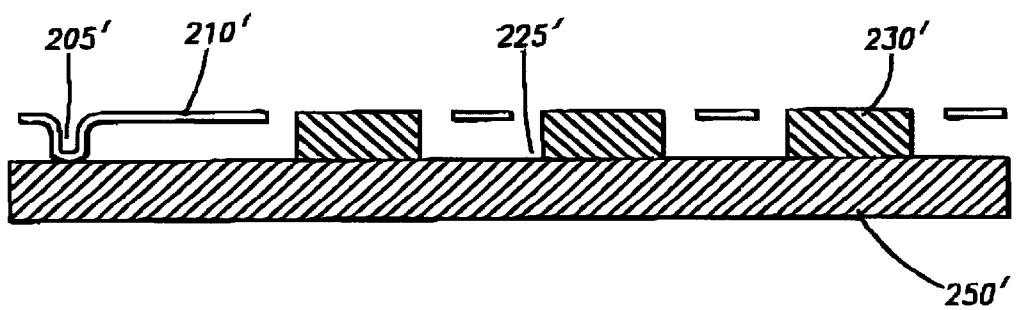

Another variation of the device 200' is to have square islands and square holes in the membrane as shown in FIGS. 3A, 3B. Now the device does not require release holes and is easier to layout. All other considerations and explanations apply equally here as described in the previous paragraph. Other island and hole shapes are also possible.

Figure 4B:
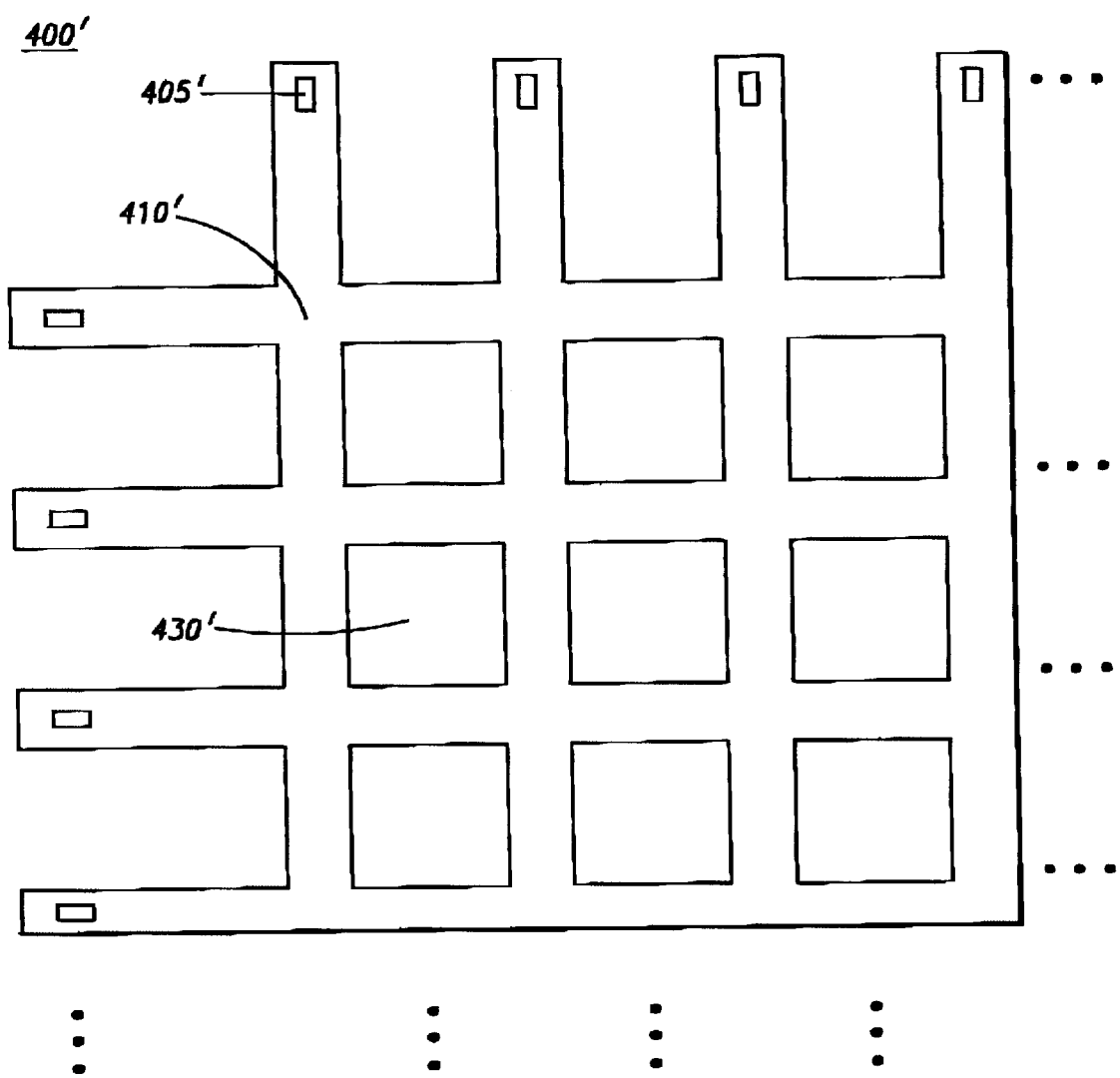

Another variation of the device, if achromatic behavior is not important, is not to have the islands as shown in FIGS. 4A, 4B. The device is now simpler with one reduced processing/masking step. To achieve full extinction, the area of the membrane 410 should be equal to the area of the holes 430 in the membrane. Anchors 405 are similarly designed and release holes 440 serve the same function. The top surface of the membrane is mλ/2 above the substrate, where m is typically 3 or 4.

Process and device fabrication of the preferred embodiment shown in FIG. 2 is now described. The process flow is shown in FIGS. 5A–5H starting with a silicon wafer 250. The first lithography mask defines the islands 230 which emerge after the silicon is etched down 2.32 μm with RIE (reactive ion etching) as shown in FIG. 5B. This is followed by growing a thin thermal oxide 235 in the range of 200–600 angstroms. LPCVD polysilicon or amorphous silicon 245 is deposited next as the sacrificial layer. It is important that the poly or amorphous silicon be optically smooth. The polysilicon is patterned and etched down to the oxide to define the anchors 205 as shown in FIG. 5E. Sacrificial layer 245 may be PSG (phospho-silicate glass) or some other oxide, which is removed using hydrofluoric acid. Sacrificial layer 245 may also be a polymer, which is removed using an oxygen plasma etch. This is followed by depositing LPCVD silicon nitride 255 as the mechanical layer. The silicon nitride may be stoichiometric or silicon rich. The silicon nitride is defined and etched after patterning the photoresist 265. Xenon difluoride etch is used to remove the polysilicon or amorphous silicon sacrificial layer. Finally the photoresist 265 is removed with an oxygen plasma etch followed by a blanket aluminum or gold evaporation.

The foregoing description of the invention has been presented for purposes of illustration and description. It is not intended to be exhaustive or to limit the invention to the precise forms disclosed. Obviously, many modifications and variations will be apparent to practitioners skilled in this art.

What is claimed is:

1. A controllable diffractive element, comprising:
    a substrate with at least a portion being substantially reflective;
    a membrane with with a front surface, a back surface, the membrane including a plurality of first apertures extending from the front to the back surface, at least a portion of the front surface being substantially reflective, wherein the membrane has an X axis and a Y axis defining a membrane plane, the plurality of first apertures being positioned sufficiently symmetrically along the X and Y axes to provide diffraction of the light incident on the membrane and substrate that is selectably independent of a polarization state of the light incident on the membrane and substrate; and
    at least one anchor coupling the membrane and the substrate at a first distance in a passive state, wherein in an active state an application of a force to the membrane modifies the first distance and provides a controllable diffraction of light that is incident on the substrate and the membrane.

2. The diffractive element of claim 1, wherein the positioning of the plurality of first apertures is symmetric along the X and Y axes.

3. A two-dimensional controllable diffractive element, comprising:
    a substrate with at least a portion being substantially reflective;
    a plurality of islands coupled to the substrate, at least a portion of the plurality of islands being substantially reflective;
    a membrane with a front surface, a back surface, the membrane including a plurality of first apertures extending from the front to the back surface, each of an island corresponding to a first aperture, at least a portion of the front surface being substantially reflective;
    at least one anchor coupling the membrane and the substrate at a first distance in a passive state, wherein in an active state an application of a force to the membrane modifies the first distance and provides a controllable diffraction of light that is incident on the substrate and the membrane.

4. The diffractive element of claim 3, wherein the force is an electrostatic force.

5. The diffractive element of claim 4, wherein the electrostatic force is generated by an applied voltage.

6. The diffractive element of claim 5, wherein the voltage includes an alternating current component.

7. The diffractive element of claim 3, wherein at least a portion of the plurality of islands are integrally formed with at least a portion of the substrate.

8. The diffractive element of claim 3, wherein all of the plurality of islands are integrally formed with the substrate.

9. The diffractive element of claim 3, wherein at least a portion of the plurality of islands are applied to at least a portion of the substrate.

10. The diffractive element of claim 3, wherein all of the plurality of islands are applied to the substrate.

11. The diffractive element of claim 3, wherein the membrane has an X axis and a Y axis defining a membrane plane, the plurality of first apertures being positioned to provide diffraction of the light incident on the membrane and substrate that is selectably independent of a polarization state of the light incident on the membrane and substrate.

12. The diffractive element of claim 3, wherein the membrane has an X axis and a Y axis defining a membrane plane, the plurality of first apertures being positioned sufficiently symmetrically along the X and Y axes to provide diffraction of the light incident on the membrane and substrate that is selectably independent of a polarization state of the light incident on the membrane and substrate.

13. The diffractive element of claim 12, wherein the positioning of the plurality of first apertures is symmetric along the X and Y axes.

14. The diffractive element of claim 3, wherein the membrane has an X axis and a Y axis defining a membrane plane, the plurality of first apertures being positioned sufficiently periodically along the X and Y axes to provide a controllable diffraction of the light incident on the membrane and substrate with a desired magnitude.

15. The diffractive element of claim 12, wherein positioning of the plurality of first apertures is periodic along the X and Y axes.

16. A two-dimensional controllable diffractive element, comprising:
    a substrate with at least a portion being substantially reflective;
    a plurality of islands coupled to the substrate, the plurality of islands having a total illuminated surface area of $A_i$, at least a portion of the plurality of islands being substantially reflective;
    a membrane with a front surface, a back surface, the membrane including a plurality of first apertures extending from the front to the back surface, each of an island corresponding to a first aperture, the plurality of first apertures having a total illuminated surface area of $A_a$, and the membrane having a total illuminated surface area $A_m$, with $A_m$ not including $A_a$, and an illuminated surface area $A_d$ defined as $A_a$ minus $A_i$, at least a portion of the first surface being substantially reflective; and
    at least one anchor coupling the membrane and the substrate at a first distance in a passive state, wherein in an active state an application of a force to the membrane modifies the first distance and provides a controllable diffraction of light that is incident on the substrate and the membrane; and wherein the magnitudes of the illuminated surface areas Am, $A_i$, and $A_d$ and the ratios of the areas $A_m$, $A_i$, and $A_d$ are selected to provide a substantially achromatic diffraction of the diffractive element over a wavelength range of light that illuminates the diffractive element.

17. The diffractive element of claim 16, wherein the membrane includes a plurality of second apertures utilized for the processing of the diffractive element, and the illuminated surface area of the plurality of second apertures is defined as $A2_a$.

18. The diffractive element of claim 17, wherein the illuminated surface area $A_d$ is defined as $A2_a$ plus $A_a$ minus $A_i$.

19. The diffractive element of claim 16 wherein the force is an electrostatic force.

20. The diffractive element of claim 19 wherein the electrostatic force is generated by an applied voltage.

21. The diffractive element of claim 20 wherein the voltage includes an alternating current component.

22. The diffractive element of claim 16, wherein the membrane has an X axis and a Y axis defining a membrane plane, the plurality of first apertures being positioned to provide diffraction of the light incident on the membrane and substrate that is selectably independent of a polarization state of the light incident on the membrane and substrate.

23. The diffractive element of claim 16, wherein the membrane has an X axis and a Y axis defining a membrane plane, the plurality of first apertures being positioned sufficiently symmetrically along the X and Y axes to provide diffraction of the light incident on the membrane and substrate that is selectably independent of a polarization state of the light incident on the membrane and substrate.

24. The diffractive element of claim 23 wherein the positioning of the plurality of first apertures is symmetric along the X and Y axes.

25. The diffractive element of claim 16, wherein the membrane has an X axis and a Y axis defining a membrane plane, the plurality of first apertures being positioned sufficiently periodically along the X and Y axes to provide a controllable diffraction of the light incident on the membrane and substrate with a desired magnitude.

26. The diffractive element of claim 24, wherein positioning of the plurality of first apertures is periodic along the X and Y axes.

27. The diffractive element of claim 16, wherein at least a portion of the plurality of islands are integrally formed with at least a portion of the substrate.

28. The diffractive element of claim 16, wherein all of the plurality of islands are integrally formed with the substrate.

29. The diffractive element of claim 16, wherein at least a portion of the plurality of islands are applied to at least a portion of the substrate.

30. The diffractive element of claim 16, wherein all of the plurality of islands are applied to the substrate.

31. The diffractive element of claim 16, wherein the membrane has an X axis and a Y axis defining a membrane plane, the plurality of first apertures being positioned to provide diffraction of the light incident on the membrane and substrate that is selectably independent of a polarization state of the light incident on the membrane and substrate.

32. The diffractive element of claim 16, wherein the membrane has an X axis and a Y axis defining a membrane plane, the plurality of first apertures being positioned sufficiently symmetrically along the X and Y axes to provide diffraction of the light incident on the membrane and substrate that is selectably independent of a polarization state of the light incident on the membrane and substrate.

33. The diffractive element of claim 32, wherein the positioning of the plurality of first apertures is symmetric along the X and Y axes.

34. The diffractive element of claim 16, wherein the membrane has an X axis and a Y axis defining a membrane plane, the plurality of first apertures being positioned sufficiently periodically along the X and Y axes to provide a controllable diffraction of the light incident on the membrane and substrate with a desired magnitude.

35. The diffractive element of claim 33, wherein positioning of the plurality of first apertures is periodic along the X and Y axes.

36. The diffractive element of claim 16, wherein the first distance is $m\lambda/2$ beneath the membrane, wherein m is an integer and $\lambda$ is a center wavelength of the light that illuminates the diffractive element.

37. The element of claim 16, wherein illuminated surface area $A_d$ is $1/(2N)$ times the area of the illuminated surface area $A_m$, where N is an integer.

38. A fiber optic component, comprising:

an input optical fiber capable of carrying an optical beam, the input optical fiber having an input optical fiber longitudinal axis and an input optical fiber endface;

a lens optically coupled to the input optical fiber, the lens capable of collimating the optical beam from the input optical fiber, the lens having an optical axis and an input focal plane and an output focal plane;

an output optical fiber optically coupled to the lens, the output optical fiber having an output optical fiber longitudinal axis and an output optical fiber endface; and a controllable diffractive element optically coupled to the lens, the controllable diffractive element capable of controllably reflecting substantially none to substantially all of the optical beam from the input optical fiber through the lens, back through the lens and into the output optical fiber, the controllable diffractive element capable of modifying at least one characteristic of the optical beam, the controllable diffractive element having an at least one reflective surface, wherein the controllable diffractive element comprises a substrate a plurality of islands coupled to the substrate, the plurality of islands having a total illuminated surface area of $A_1$;

a membrane with a front surface, a back surface, the membrane including a plurality of first apertures extending from the front to the back surface, each of an island corresponding to a first aperture, the plurality of first apertures having a total illuminated surface are of $A_1$, and the membrane having a total illuminated surface are $A_m$, with $A_m$ not including $A_a$, and an illuminated surface area $A_d$ defined as $A_a$ minus $A_i$, and at least one anchor coupling the membrane and the substrate at a first distance in a passive state, wherein in an active state an application of a force to the membrane modifies the first distance and provides a controllable diffraction of light that is incident on the substrate and the membrane, and wherein the magnitudes of the illuminated surface areas $A_m$, $A_i$, and $A_d$ and the ratios of the areas $A_m$, $A_i$, and $A_d$ are selected to provide a substantially achromatic diffraction element over a wavelength range of light that illuminates the diffractive element.

\* \* \* \* \*